(12) United States Patent
Kim et al.

(10) Patent No.: US 11,626,580 B2
(45) Date of Patent: Apr. 11, 2023

(54) MANUFACTURING METHOD OF DISPLAY APPARATUS USING LASER IRRADIATION

(71) Applicant: Samsung Display Co., Ltd., Yongin-si (KR)

(72) Inventors: Seungwan Kim, Yongin-si (KR); Jinkuk Wee, Yongin-si (KR); Woojin Lee, Yongin-si (KR); Kyunguk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 17/036,819

(22) Filed: Sep. 29, 2020

(65) Prior Publication Data

US 2021/0288296 A1    Sep. 16, 2021

(30) Foreign Application Priority Data

Mar. 13, 2020    (KR) .......................  10-2020-0031316

(51) Int. Cl.
| | |
|---|---|
| *H01L 51/56* | (2006.01) |
| *H01L 27/32* | (2006.01) |
| *H01L 51/52* | (2006.01) |
| *G09G 3/3233* | (2016.01) |

(52) U.S. Cl.
CPC .......... *H01L 51/56* (2013.01); *H01L 27/3234* (2013.01); *H01L 27/3244* (2013.01); *H01L 51/524* (2013.01); *G09G 3/3233* (2013.01); *H01L 2227/323* (2013.01)

(58) Field of Classification Search
CPC ... H01L 51/56; H01L 27/3244; H01L 51/524; H01L 2227/323
See application file for complete search history.

(56) References Cited

U.S. PATENT DOCUMENTS

| | | | |
|---|---|---|---|
| 8,916,018 B2 * | 12/2014 | Lee .......................... | H01L 51/56 156/286 |
| 9,755,192 B2 | 9/2017 | You et al. | |
| 10,056,568 B2 | 8/2018 | Min et al. | |
| 10,171,636 B2 | 1/2019 | Yeo et al. | |
| 10,332,947 B2 | 6/2019 | Kim et al. | |
| 10,396,311 B2 | 8/2019 | Lee et al. | |
| 2008/0296272 A1 * | 12/2008 | Lei ...................... | H05K 3/0038 219/121.68 |

(Continued)

FOREIGN PATENT DOCUMENTS

| | | |
|---|---|---|
| KR | 10-0950017 B1 | 3/2010 |
| KR | 10-2012-0119082 A | 10/2012 |

(Continued)

OTHER PUBLICATIONS

EO Technics, machine translation, KR1020080113702, Dec. 2008 (Year: 2008).*

*Primary Examiner* — Tracie Y Green
(74) *Attorney, Agent, or Firm* — Lewis Roca Rothgerber Christie LLP

(57) ABSTRACT

A manufacturing method of a display apparatus includes forming a display layer on a substrate; forming an opening by irradiating laser onto the display layer; and sealing the display layer formed on the substrate. The laser is irradiated according to a spiral movement path, and the opening is formed by irradiating the laser at least twice at the same location.

20 Claims, 12 Drawing Sheets

(56) References Cited

U.S. PATENT DOCUMENTS

| | | | |
|---|---|---|---|
| 2009/0065482 A1* | 3/2009 | Komiyama | B41J 2/1634 |
| | | | 216/99 |
| 2014/0179041 A1* | 6/2014 | Huh | H01L 51/5253 |
| | | | 438/28 |
| 2014/0225131 A1* | 8/2014 | Benson | G06F 1/1643 |
| | | | 257/82 |
| 2020/0006661 A1* | 1/2020 | Shinokawa | B23K 26/123 |
| 2020/0350384 A1* | 11/2020 | Park | H01L 51/5225 |

FOREIGN PATENT DOCUMENTS

| | | |
|---|---|---|
| KR | 10-2016-0126175 A | 11/2016 |
| KR | 10-2017-0112790 A | 10/2017 |
| KR | 10-2017-0140489 A | 12/2017 |
| KR | 10-2018-0026599 A | 3/2018 |
| KR | 10-2019-0027003 A | 3/2019 |

* cited by examiner

MANUFACTURING METHOD OF DISPLAY APPARATUS USING LASER IRRADIATION

CROSS-REFERENCE TO RELATED APPLICATION

This application claims priority to and the benefit of Korean Patent Application No. 10-2020-0031316, filed on Mar. 13, 2020, in the Korean Intellectual Property Office, the disclosure of which is incorporated herein in its entirety by reference.

BACKGROUND

1. Field

One or more embodiments relate to a manufacturing method of a display apparatus.

2. Description of Related Art

With the rapid development in display field for visually expressing electrical signal information, a variety of display apparatuses having good characteristics, such as, reduced thickness and weight, and low power consumption have been developed. Also, to expand a display area where an image is displayed, a physical switch, etc. may be removed from a front surface of a display apparatus to introduce an electronic component such as a camera or a sensor in the display area.

To locate the electronic component such as a camera in the display area, the display area has to include a transmission area where light may pass, and the camera or other components may be disposed in the transmission area. Therefore, the transmission area should have relatively high transmittance to prevent the degradation in the performance of the electronic component such as a camera.

SUMMARY

One or more embodiments of the present disclosure provide a manufacturing method of a display apparatus having a relatively high transmittance.

Additional aspects will be set forth in part in the description which follows and, in part, will be apparent from the description, or may be learned by practice of the presented embodiments of the disclosure.

According to one or more embodiments, there is provided a manufacturing method of a display apparatus including: forming a display layer on a substrate; forming an opening by irradiating laser onto the display layer; and sealing the display layer formed on the substrate, wherein the layer is irradiated according to a spiral movement path, and the opening is formed by irradiating the laser at least twice at the same location.

In one or more embodiments, the laser may be irradiated twice to form the opening.

In one or more embodiments, an overlap ratio of spots of the laser first irradiated may be greater than an overlap ratio of spots of the laser secondly irradiated.

In one or more embodiments, the substrate formed on the display layer may be located within a first chamber before the irradiation of the laser, and the first chamber may be configured to maintain a vacuum atmosphere when the laser is irradiated.

In one or more embodiments, in the first chamber, the substrate may be fixed to make the display layer face downwards.

In one or more embodiments, the substrate may be attached to an encapsulation substrate in a second chamber different from the first chamber, and the substrate and the encapsulation substrate are attached to each other and may directly face each other in the opening.

In one or more embodiments, an intensity of the laser may differ according to a location of a spiral.

In one or more embodiments, the display apparatus may include a first area that is a transmission area, a second area that surrounds the first area and configured to display an image, and a third area located between the first area and the second area, the third area being a non-display area, and the opening may be formed corresponding to the first area.

In one or more embodiments, an electronic component may be located at a location overlapping the opening.

According to one or more embodiments, there is provided a manufacturing method of a display apparatus including a first area that is a transmission area, a second area that surrounds the first area and configured to display an image, and a third area located between the first area and the second area, the third area being a non-display area. The manufacturing method includes: forming, on a substrate, a display layer including a thin film transistor, an organic light-emitting diode electrically connected to the thin film transistor, and a capping layer on an opposite electrode of the organic light-emitting diode; and forming an opening at a location corresponding to the first area by irradiating laser onto the display layer in a vacuum atmosphere, wherein the thin film transistor and the organic light-emitting diode are located in the second area, and when the display layer is formed, a gate insulating layer between a semiconductor layer and a gate electrode of the thin film transistor, an interlayer insulating layer on the gate electrode, a planarization layer covering the thin film transistor, the opposite electrode, and the capping layer, which are formed in the first, second, and third areas, are removed from the first area due to irradiation of the laser.

In one or more embodiments, the manufacturing method may further include forming a buffer layer on the substrate before the display layer is formed, wherein the buffer layer may be removed from the first area due to the irradiation of the laser.

In one or more embodiments, the manufacturing method may further include sealing the display layer on the substrate.

In one or more embodiments, the substrate may be attached to an encapsulation substrate, and the substrate and the encapsulation substrate may directly face each other in the opening.

In one or more embodiments, an electronic component may be located at a location overlapping the opening.

In one or more embodiments, the laser may be spirally irradiated.

In one or more embodiments, the laser may be irradiated at least twice at the same location.

In one or more embodiments, an intensity of the laser at a center of a spiral may be less than an intensity of the laser at an outer portion of the spiral.

In one or more embodiments, the laser may be irradiated twice.

In one or more embodiments, an irradiation time of the laser first irradiated may be greater than an irradiation time of the laser secondly irradiated.

In one or more embodiments, an overlap ratio of spots of the laser first irradiated may be greater than an overlap ratio of spots of the laser secondly irradiated.

BRIEF DESCRIPTION OF THE DRAWINGS

The above and other aspects and features of example embodiments of the disclosure will be more apparent from the following description taken in conjunction with the accompanying drawings, in which.

DETAILED DESCRIPTION

Figure 1:
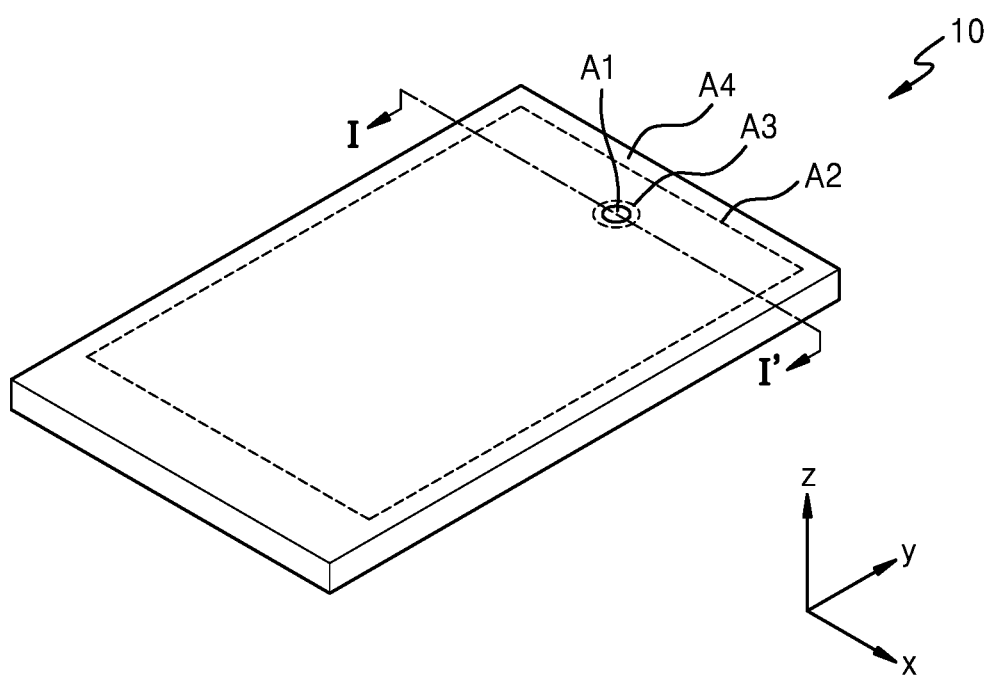
FIG. 1 is a schematic perspective view of a display apparatus according to one or more embodiments of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating example embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

The present disclosure will now be described more fully with reference to the accompanying drawings, in which example embodiments of the disclosure are shown. Like reference numerals in the drawings denote like elements, and thus their description will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being formed on another layer, region, or component, it can be directly or indirectly formed on the other layer, region, or component. For example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a component, such as a layer, a film, a region, or a plate, is referred to as being connected to another component, the component can be directly connected to the other component or indirectly connected thereto with intervening components therebetween. For example, when a component, such as a layer, a film, a region, or a plate, is referred to as being electrically connected to another component, the component can be directly electrically connected to the other component or indirectly connected thereto with intervening components therebetween.

As used herein, a plan view is a view that can be seen when all elements on the same layer or different layers are visible on the same plane, or a view from the top or from a direction orthogonal to a substrate on which elements are located assuming that all relevant elements are visible.

FIG. 1 is a schematic perspective view of a display apparatus according to one or more embodiments of the present disclosure.

Referring to FIG. 1, a display apparatus 10 may include a first area A1 and a second area A2 surrounding the first area A1.

The first area A1 may be an area where a component, which is capable of providing various functions to the display apparatus 10, is disposed (e.g., located). For example, when the component includes a sensor, a camera, or the like, that uses light, the first area A1 may include a transmission area where the light for the sensor or the light directed to the camera may penetrate.

The second area A2 may be an area where pixels, e.g., an array of the pixels, may be arranged, and the second area A2 may display an image through the array of the pixels. The first area A1 may be entirely surrounded by the second area A2. Each pixel included in the display apparatus 10 may be a display element capable of emitting light of a certain color and may include a light-emitting diode. The light-emitting diode may include an organic light-emitting diode including an organic material as an emission layer. In one or more embodiments, the light-emitting diode may include an inorganic light-emitting diode. In one or more embodiments, the light-emitting diode may include quantum dots as an emission layer. Hereinafter, for convenience of explanation, the light-emitting diode includes an organic light-emitting diode (OLED).

A third area A3 may be disposed between the first area A1 and the second area A2. The third area A3 may be a non-display area where no pixels are arranged and wires bypassing the first area A1 are arranged.

Like the third area A3, a fourth area A4 surrounding the second area A2 extending along edges (or a periphery) of the second area A2 may also be a non-display area where no pixels are arranged, and in the fourth area A4, various wires, internal circuits, and the like may be arranged.

FIG. 1 illustrates that the first area A1 is located at a central portion of the second area A2 in a width direction (e.g., ±x direction) of the display apparatus 10, but in another embodiment, the first area A1 may be located at a left side or a right side with respect to the center of the second area A2 in the width direction of the display apparatus 10. Also, the first area A1 may be located at various locations such as an upper portion, a central portion, and a lower portion in a lengthwise direction (e.g., a ±y direction) of the display apparatus 10.

Also, FIG. 1 illustrates that the display apparatus 10 includes one first area A1, but in another embodiment, the display apparatus 10 may include a plurality of first areas A1.

Figure 2:
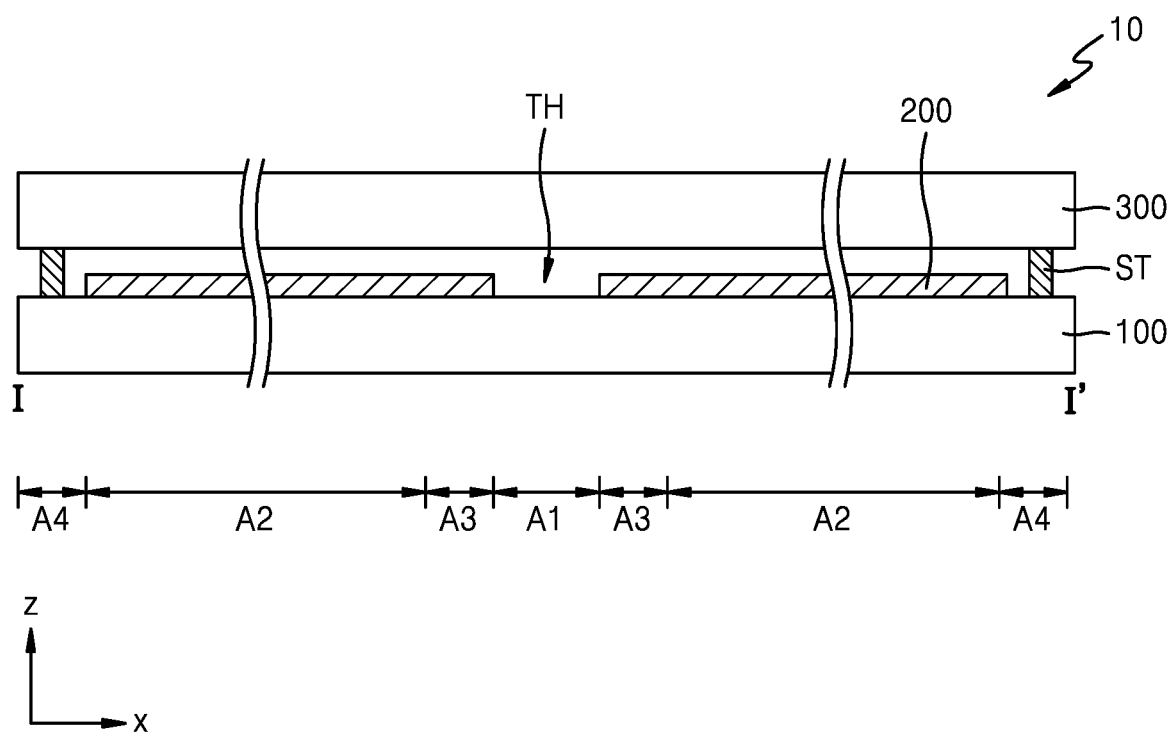
FIG. 2 is a schematic cross-sectional view of an example of a cross-section taken along the line I-I' of FIG. 1.

FIG. 2 is a schematic cross-sectional view of an example of a cross-section taken along the line I-I' of FIG. 1;

Referring to FIG. 2, the display apparatus 10 includes a display layer 200 disposed on the substrate 100.

The substrate 100 may include a glass material or polymer resin. For example, the substrate 100 may include a glass material including silicon oxide ($SiO_2$) as a main component or may include resin such as reinforced plastics.

The display layer 200 may be disposed corresponding to the second area A2 and may include a plurality of pixels. Each pixel of the display layer 200 may include a pixel circuit and a display element electrically connected to the pixel circuit. The pixel circuit may include a transistor and a storage capacitor, and the display element may include a light-emitting diode, e.g., an organic light-emitting diode OLED.

The display layer 200 may be covered by an encapsulation substrate 300. The encapsulation substrate 300 may include a glass material or polymer resin. For example, the encapsulation substrate 300 may include a glass material including $SiO_2$ as a main component or may include resin such as reinforced plastics. The encapsulation substrate 300 may face the substrate 100, and a sealant ST may be disposed between the substrate 100 and the encapsulation substrate 300.

The sealant ST may be in the fourth area A4 and may entirely surround the display layer 200. For example, on a plan view, the second area A2 may be entirely surrounded by the sealant ST.

The sealant ST may include an inorganic material, for example, frit. The sealant ST may be formed by using a dispenser or a screen printing method. In some cases, frit may include a powder type glass based material, but in one or more embodiments of the present disclosure, the frit also includes a paste state in which a main component such as $SiO_2$, a laser or infrared absorber, an organic binder, a filler for decreasing a thermal expansion coefficient, or the like, are included. The frit may be hardened from the paste state after the organic binder and moisture are removed through a drying or firing process. The laser or infrared absorber may include a transition metal compound. A laser beam may be used as a thermal source for attaching the substrate 100 and the encapsulation substrate 300 to each other by hardening the sealant ST.

However, one or more embodiments of the present disclosure are not limited thereto, and the display layer 200 may be sealed by a thin film encapsulation layer formed by stacking at least one inorganic encapsulation layer and at least one organic encapsulation layer.

The display layer 200 may include an opening TH formed by removing at least a portion of the display layer 200. The opening TH may be defined as a region where all layers stacked on the substrate 100 to form the display layer 200 are removed, at a location corresponding to the first area A1. A component may overlap the first area A1, and light emitted from the component to the outside or directed to the component from the outside may pass through the first area A1 that is a transmission area. For example, the component may be disposed under the substrate 100 and may include an electronic component. Therefore, to prevent (or reduce) the degradation in the performance of the component, the first area A1 may have great transmittance, and to this end, the existence of foreign materials such as particles in the opening TH has to be prevented or reduced.

Figure 3:
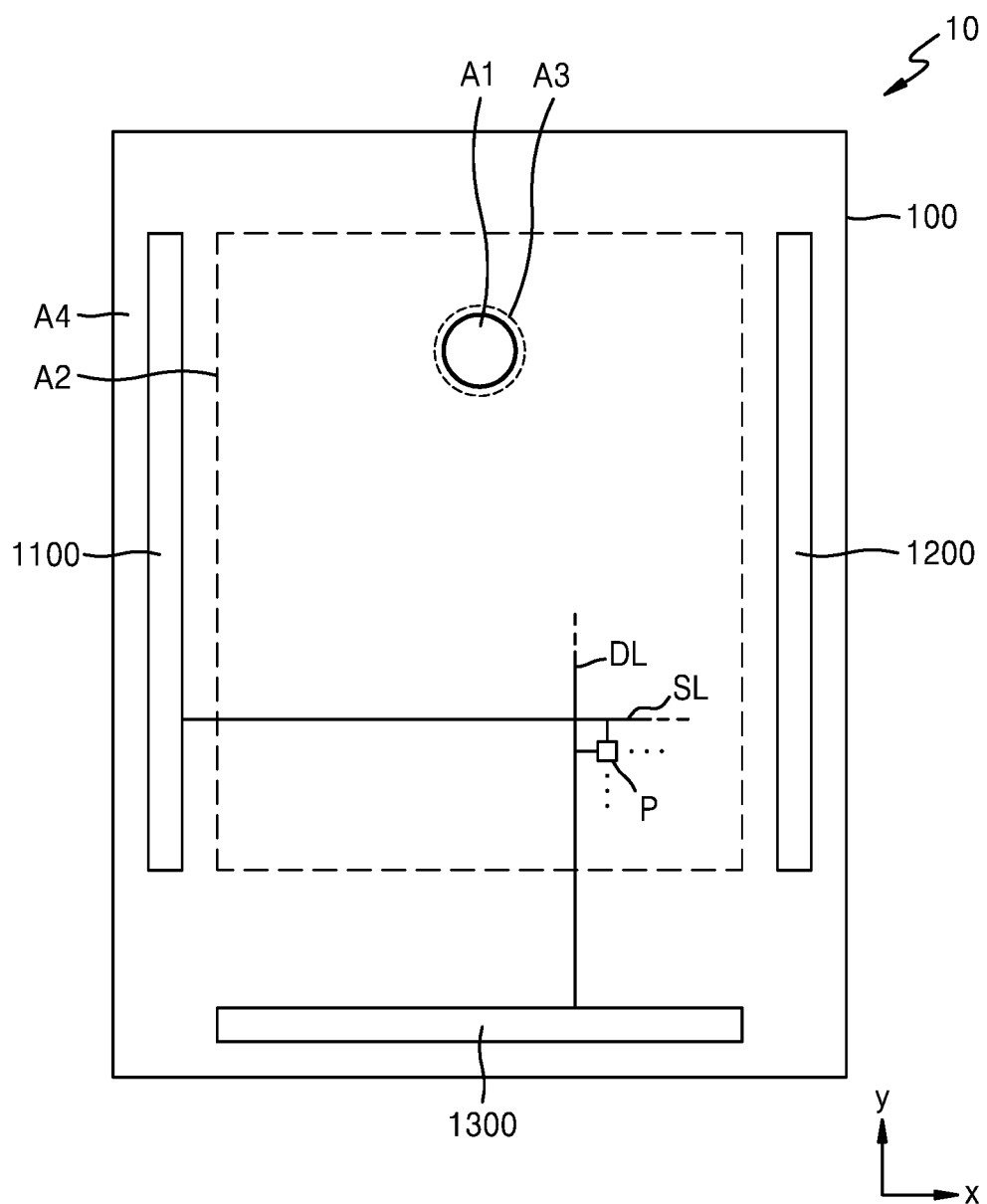
FIG. 3 is a schematic plan view of the display apparatus of FIG. 1.
Figure 4:
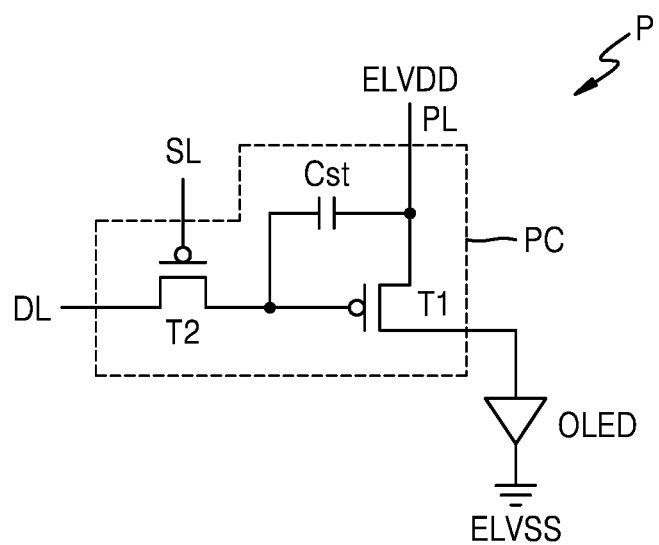
FIG. 4 illustrates an example of an equivalent circuit diagram of a pixel of the display apparatus of FIG. 1.

FIG. 3 is a schematic plan view of the display apparatus of FIG. 1 and FIG. 4 illustrates an example of an equivalent circuit diagram of a pixel of the display apparatus of FIG. 1.

FIG. 3 is a plan view for explaining the display apparatus 10 of FIG. 1 according to a different aspect from FIG. 2.

As described above, the display apparatus 10 may include the first area A1, the second area A2 surrounding the first area A1, the third area A3 between the first area A1 and the second area A2, and the fourth area A4 surrounding the second area A2.

The display apparatus 10 may include pixels P arranged in the second area A2. As shown in FIG. 4, each pixel P may include the pixel circuit PC and the display element electrically connected to the pixel circuit PC, for example, the organic light-emitting diode OLED. The pixel circuit PC may include a first transistor T1, a second transistor T2, and a storage capacitor Cst. The pixel P may emit red light, green light, blue light, or white light. The first transistor T1 and the second transistor T2 may be thin film transistors.

The first transistor T1, that is a driving transistor, may be connected to a driving power line PL and a storage capacitor Cst, and may control a driving current flowing from the driving power line PL to the organic light-emitting diode OLED in response to a value of a voltage corresponding to the amount of charge stored in the storage capacitor Cst. The organic light-emitting diode OLED may emit light having brightness corresponding to the driving current. A second power voltage ELVSS may be supplied to an opposite electrode (e.g., a cathode) of the organic light-emitting diode OLED.

The second transistor T2, that is a switching transistor, may be connected to a scan line SL and a data line DL and may transmit a data voltage input from the data line DL to the first transistor T1 according to a switching voltage input from the scan line SL.

The storage capacitor Cst may be connected to the second transistor T2 and the driving power line PL and may store a voltage (or a charge) corresponding to a difference between a voltage received from the second transistor T2 and a first power voltage ELVDD provided to the driving power line PL.

FIG. 4 illustrates that the pixel circuit PC includes two transistors T1 and T2 and one storage capacitor Cst, but in another embodiment, the number of transistors and the number of storage capacitors may vary according to a design of the pixel circuit PC.

Referring back to FIG. 3, the third area A3 may surround the first area A1. The first area A1 may be a transmission area through which light may pass, and the third area A3 may be an area where display elements, such as, organic light-emitting diodes to emit light, are not arranged. Signal lines for providing signals to the pixels P located around the first area A1 may pass through the third area A3. This will be described with reference to FIG. 5.

In the fourth area A4, first and second scan drivers 1100 and 1200 for respectively providing scan signals to the pixels, a data driver 1300 for providing a data signal to each pixel P, a main power wiring (not shown) for providing first and second power voltages, etc. may be arranged. The first scan driver 1100 and the second scan driver 1200 may be respectively disposed in the fourth area A4, at respective sides of the second area A2 with the second area A2 therebetween.

FIG. 3 illustrates that the data driver 1300 is disposed close to one side of the substrate 100, but in another embodiment, the data driver 1300 may be disposed on a flexible printed circuit board (FPCB) electrically connected to a pad disposed on a side of the display apparatus 10.

Figure 5:
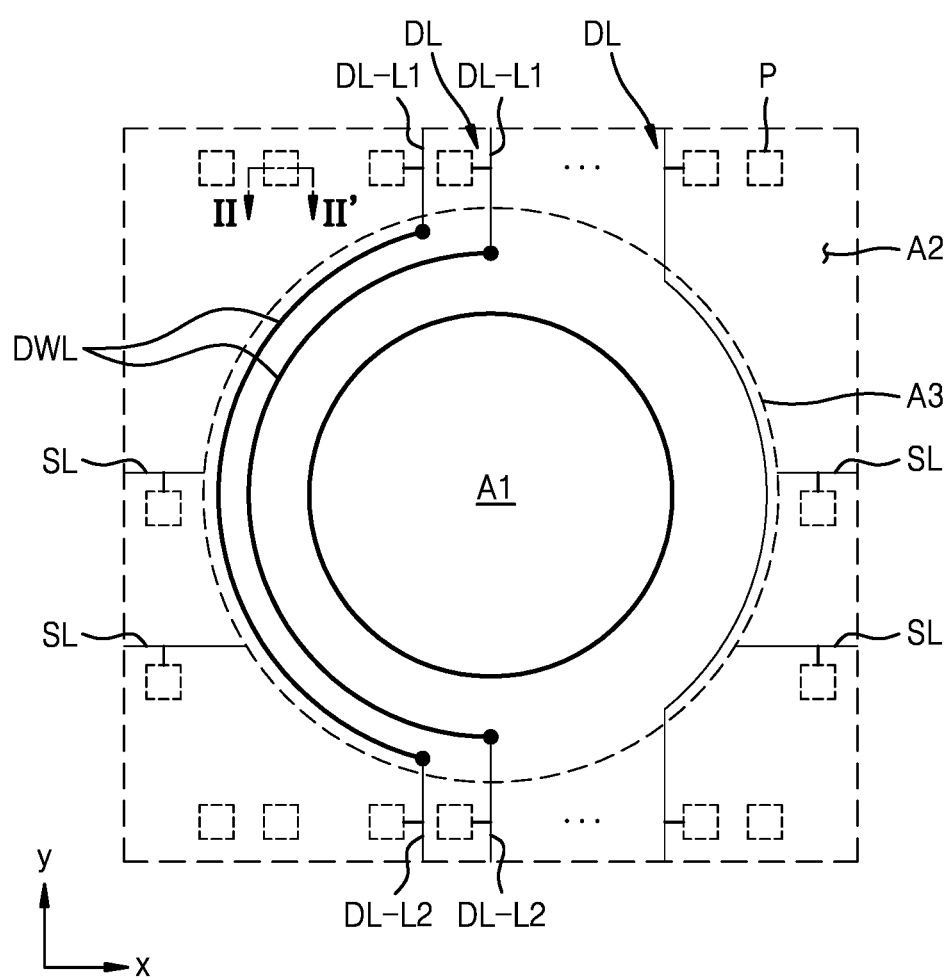
FIG. 5 is a schematic plan view of a part of the display apparatus of FIG. 1.

FIG. 5 is a schematic plan view of a part of the display apparatus of FIG. 1.

Referring to FIG. 5, some of the pixels P formed in the second area A2 may be apart from each other with respect to the first area A1. For example, the first area A1 may be located between two pixels P arranged in the ±x direction of FIG. 5. Similarly, the first area A1 may be located between the two pixels P arranged in the ±y direction of FIG. 5.

The pixels P, which are arranged in the ±y direction with the first area A1 therebetween, may be electrically connected to the same data line DL, and the data line DL may be arranged to bypass in the third area A3 along an outer portion of the first area A1.

For example, as shown in FIG. 5, a first data line DL-L1 and a second data line DL-L2, which are apart from each other with the first area A1 therebetween, may be connected by a bypass wire DWL. The bypass wire DWL may be connected to the first data line DL-L1 and the second data line DL-L2 through a contact hole. The bypass wire DWL may be disposed in the third area A3 to bypass the first area A1.

In another embodiment, the first data line DL-L1, the second data line DL-L2, and the bypass wire DWL connecting the first data line DL-L1 to the second data line DL-L2 may be integrally formed. For example, the data line DL may be formed to extend from the second area A2 and bypass the first area A1 in the third area A3.

The two pixels P arranged in the ±x direction with the first area A1 therebetween may be electrically connected to different scan lines SL, respectively. Based on the drawings, the scan lines SL arranged on a left side of the first area A1 may be electrically connected to the first scan driver 1100 described with reference to FIG. 3, and the scan lines SL arranged on a right side of the first area A1 may be electrically connected to the second scan driver 1200 described with reference to FIG. 3.

In another embodiment, when the second scan driver 1200 (of FIG. 3) is not formed, the pixels P, which are arranged in the ±x direction with the first area A1 therebetween, may be connected to the same scan line, and like the data line DL, the above-described scan line SL may include a bypassing portion extending in a circular-arc direction of the first area A1 in the third area A3.

Figure 6:
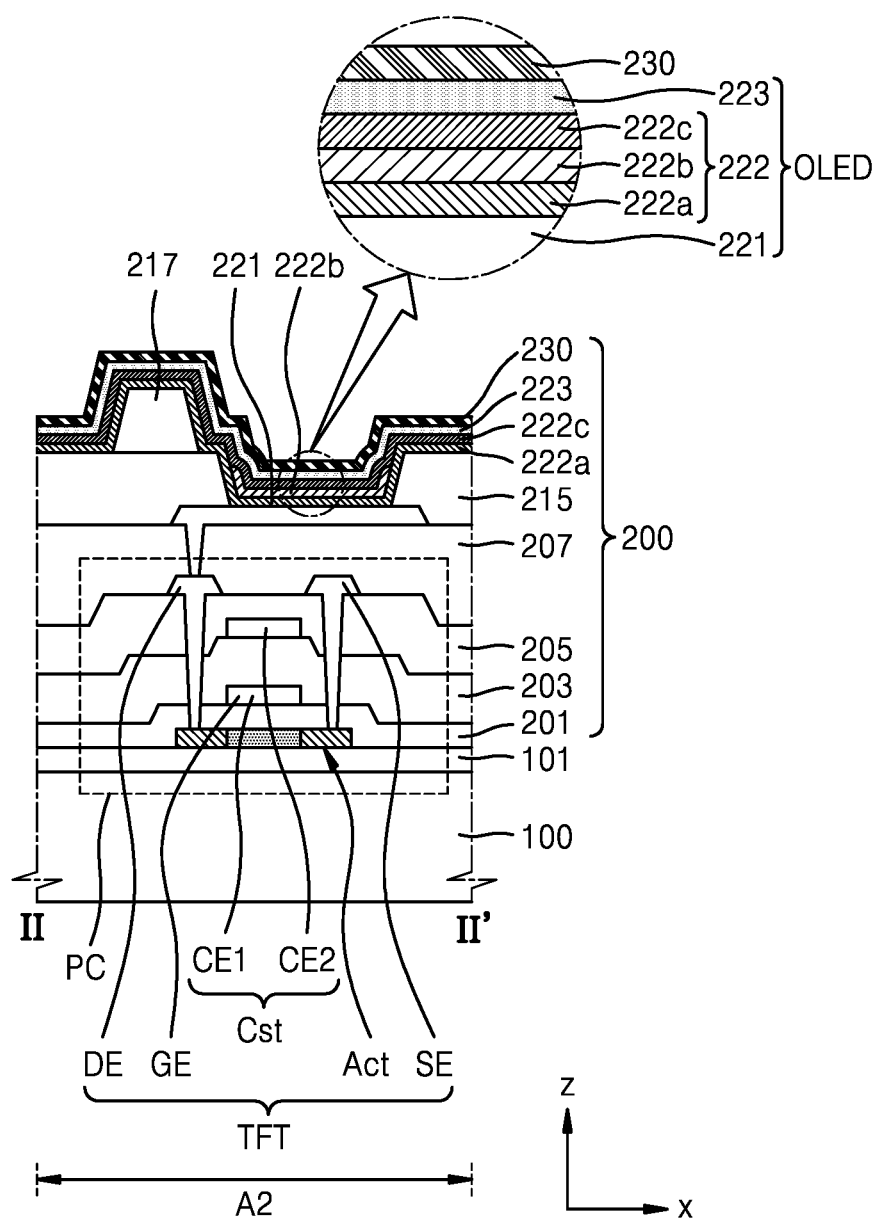
FIG. 6 is a schematic cross-sectional view of an example of a cross-section taken along the line II-II' of FIG. 5.

FIG. 6 is a schematic cross-sectional view of an example of a cross-section taken along the line II-II' of FIG. 5.

Referring to FIG. 6, the pixel circuit PC may be disposed on the substrate 100, and the organic light-emitting diode OLED electrically connected to the pixel circuit PC may be disposed on the pixel circuit PC. The substrate 100 may include glass or polymer resin. The substrate 100 may be a single layer or may include multiple layers.

A buffer layer 101 may be disposed on the substrate 100 to prevent or reduce (or protect from) the penetration of foreign materials, moisture, or external air from the bottom of the substrate 100, and provide a planar surface on the substrate 100. The buffer layer 101 may include an inorganic material such as an oxide or a nitride, an organic material, or a composite of organic/inorganic materials and may have a single-layer structure or a multilayered structure of the organic or inorganic materials. A barrier layer (not shown) may be further disposed between the substrate 100 and the buffer layer 101, the barrier layer may prevent (or protect from) the penetration of external air, or the like, to the electronic components of the apparatus 10.

The pixel circuit PC may be disposed on the buffer layer 101. The pixel circuit PC may include a thin film transistor TFT and the storage capacitor Cst. The thin film transistor TFT may include a semiconductor layer Act, a gate electrode GE, a source electrode SE, and a drain electrode DE. In the present embodiment, a top gate type in which the gate electrode GE is disposed on the semiconductor layer Act with a gate insulating layer 201 therebetween is illustrated, but according to another embodiment, the thin film transistor TFT may be a bottom gate type.

The semiconductor layer Act may include polysilicon. In one or more embodiments, the semiconductor layer Act may include amorphous silicon, an oxide semiconductor, an organic semiconductor, or the like. The gate electrode GE may include a low-resistance metal material. The gate electrode GE may include a conductive material such as molybdenum (Mo), aluminum (Al), copper (Cu), or titanium (Ti), and may be a single-layer or multi-layers including the above material(s).

The gate insulating layer 201 between the semiconductor layer Act and the gate electrode GE may include an inorganic insulating material, such as, silicon oxide, silicon nitride, silicon oxynitride, aluminum oxide, titanium oxide, tantalum oxide, or hafnium oxide. The gate insulating layer 201 may be a single-layer or multi-layers including the above material(s).

The source electrode SE and the drain electrode DE may include a conductive material such as Mo, Al, Cu, or Ti, and may be a single-layer or multi-layers including the above material(s). In one or more embodiments, each of the source electrode SE and the drain electrode DE may have a multilayered structure of Ti/Al/Ti.

The storage capacitor Cst may include a lower electrode CE1 and an upper electrode CE2 that overlap each other with a first interlayer insulating layer 203 therebetween. The storage capacitor Cst may overlap the thin film transistor TFT. FIG. 6 illustrates that the gate electrode GE of the thin film transistor TFT is the lower electrode CE1 of the storage capacitor Cst. In another embodiment, the storage capacitor Cst may not overlap the thin film transistor TFT. The storage capacitor Cst may be covered by a second interlayer insulating layer 205.

The first interlayer insulating layer 203 and the second interlayer insulating layer 205 may each include an inorganic insulating layer such as silicon oxide, silicon nitride, silicon oxynitride, aluminum oxide, titanium oxide, tantalum oxide, or hafnium oxide. The first interlayer insulating layer 203 and the second interlayer insulating layer 205 may each include a single-layer or multi-layers including the above material(s).

The pixel circuit PC including the thin film transistor TFT and the storage capacitor Cst may be covered by a planarization layer 207. The planarization layer 207 may have an upper surface that is approximately flat or substantially flat. The planarization layer 207 may include organic materials, such as, a general-purpose polymer, such as, polymethylmethacrylate (PMMA) or polystyrene (PS), a polymer derivative having a phenol-based group, or an acryl-based polymer, an imide-based polymer, an aryl-ether-based polymer, an amide-based polymer, a fluorine-based polymer, a p-xylene-based polymer, a vinyl alcohol-based polymer, and a blend thereof. In one or more embodiments, the planarization layer 207 may include polyimide.

A pixel electrode 221 may be formed on the planarization layer 207. The pixel electrode 221 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include reflective layers including silver (Ag), magnesium (Mg), Al, platinum (Pt), palladium (Pd), gold (Au), nickel (Ni), neodymium (Nd), iridium (Ir), chromium (Cr), or a compound thereof. In another embodiment, the pixel electrode 221 may further include layers disposed on and under the reflective layer, the layers including ITO, IZO, ZnO, or $In_2O_3$.

A pixel-defining layer 215 may be formed on the pixel electrode 221. The pixel-defining layer 215 may include an opening exposing an upper surface of the pixel electrode 221 and may cover edges of the pixel electrode 221. The pixel-defining layer 215 may include an organic insulating material. In one or more embodiments, the pixel-defining layer 215 may include an inorganic insulating material, such as, silicon nitride, silicon oxynitride or silicon oxide. In one or more embodiments, the pixel-defining layer 215 may include an organic insulating layer and an inorganic insulating layer.

On the pixel-defining layer 215, a spacer 217 may be formed. The spacer 217 may include an organic insulating layer such as polyimide. In one or more embodiments, the spacer 217 may include an inorganic insulating material such as silicon nitride or silicon oxide, or an organic insulating material and an inorganic insulating material.

In one or more embodiments, the spacer 217 may include a material different from that of the pixel-defining layer 215. In one or more embodiments, the spacer 217 may include the same material as the pixel-defining layer 215, and in such a case, the pixel-defining layer 215 and the spacer 217 may be concurrently (e.g., substantially simultaneously) formed through mask processes using a halftone mask. The pixel-defining layer 215 and the spacer 217 may each include polyimide.

An intermediate layer 222 may include an emission layer 222b. The emission layer 222b may include, for example, an organic material. The emission layer 222b may include a polymer organic material or a low-molecular weight organic material emitting light of a certain color. The intermediate layer 222 may further include a first functional layer 222a disposed under the emission layer 222b and/or a second functional layer 222c disposed on the emission layer 222b.

The first functional layer 222a may be a single layer or multi-layers. For example, when the first functional layer 222a includes a polymer material, the first functional layer 222a may include a hole transport layer (HTL) that has a single-layer structure and may include poly-(3,4)-ethylenedihydroxy thiophene (PEDOT) or polyaniline (PANI). When the first functional layer 222a includes a low-molecular weight material, the first functional layer 222a may include a hole injection layer (HIL) and a hole transport layer (HTL).

The second functional layer 222c may be selectively formed. For example, when the first functional layer 222a and the emission layer 222b include polymer organic materials, the second functional layer 222c may be formed. The second functional layer 222c may be a single layer or multi-layers. The second functional layer 222c may include an electron transport layer (ETL) and/or an electron injection layer (EIL).

The emission layer 222b of the intermediate layer 222 may be disposed on each pixel in the second area A2. The emission layer 222b may overlap an opening of the pixel-defining layer 215 and/or the pixel electrode 221. Each of the first and second functional layer 222a and 222c of the intermediate layer 222 may be a single body and may be formed in the second area A2 as well as the third area A3 described with reference to FIG. 5.

The opposite electrode 223 (of the OLED) may include a conductive material having a low work function. For example, the opposite electrode 223 may include a translucent or transparent layer including Ag, Mg, Al, Pt, Pd, Au, Ni, Nd, Ir, Cr, Li, Ca, or an alloy thereof. In one or more embodiments, the opposite electrode 223 may further include, on the translucent or transparent layer including the above material, a layer including ITO, IZO, ZnO, or $In_2O_3$. The opposite electrode 223 may be a single body electrode and may cover the pixel electrodes 221 in the second area A2.

On the opposite electrode 223, a capping layer 230 for improving the extraction efficiency of the light emitted from the organic light-emitting diode OLED may be disposed. The capping layer 230 may include LiF, an inorganic material, and/or an organic material.

Figure 7:
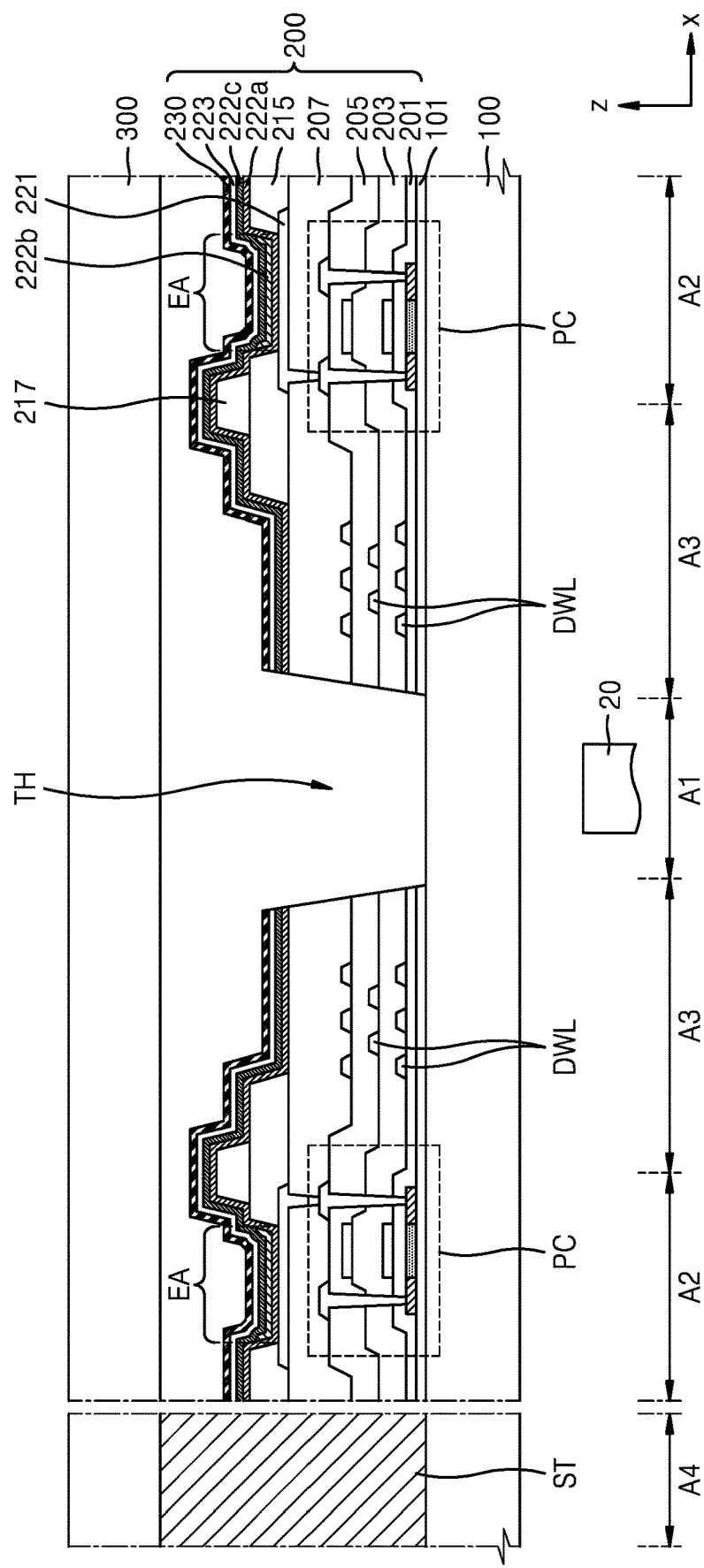
FIG. 7 is a schematic cross-sectional view of a part of first to fourth areas of FIG. 1.
Figure 8:
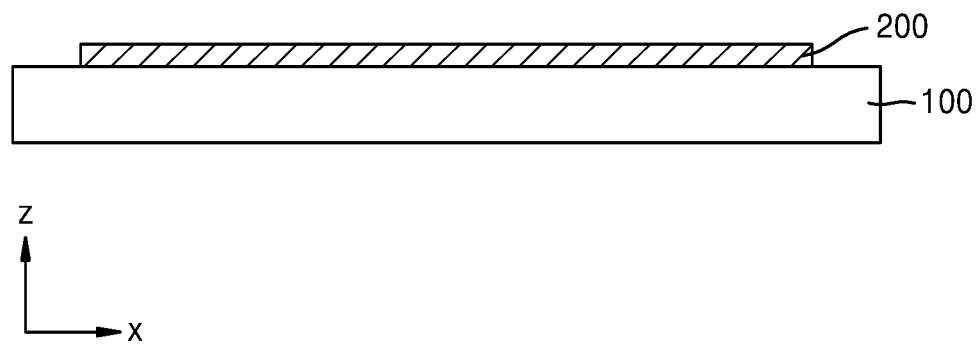
FIGS. 8 and 9 are schematic cross-sectional views of a manufacturing method of the display apparatus of FIG. 1.
Figure 9:
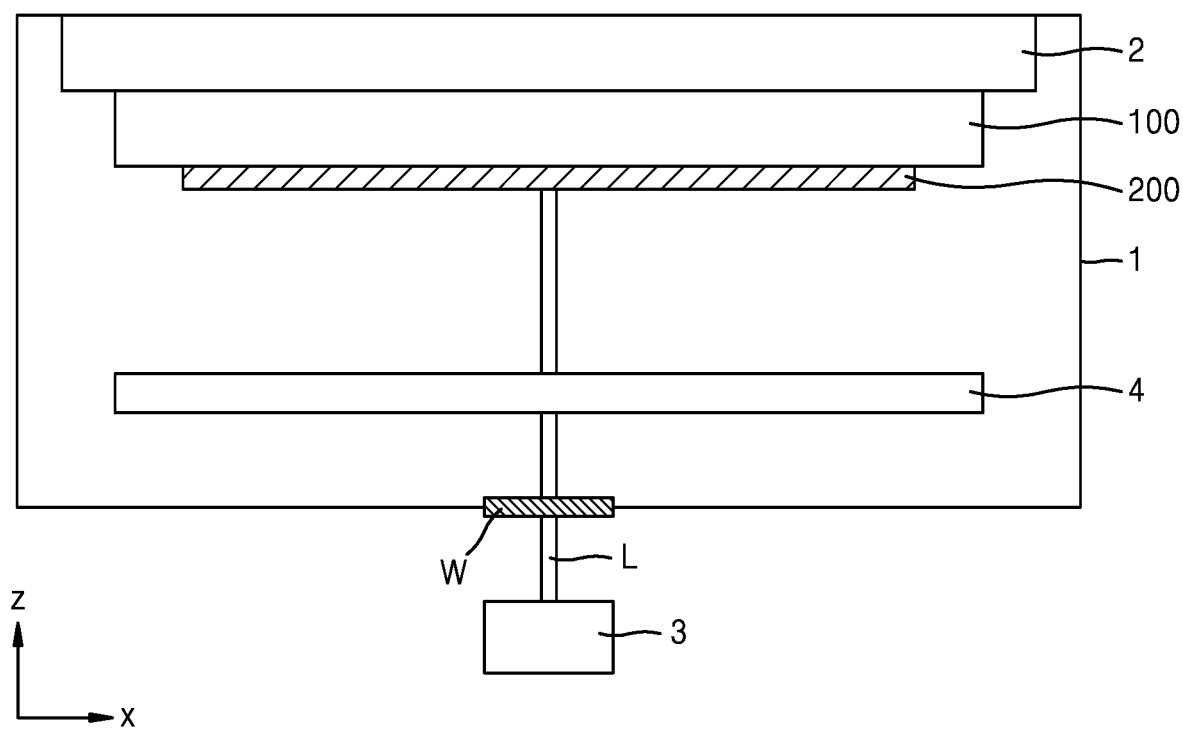
Figure 10:
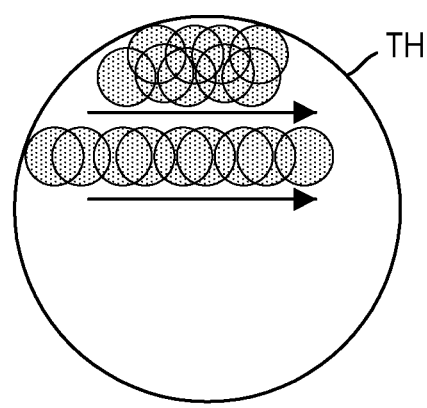
FIGS. 10 and 11 are schematic plan views of a method of forming an opening of FIG. 7.
Figure 11:
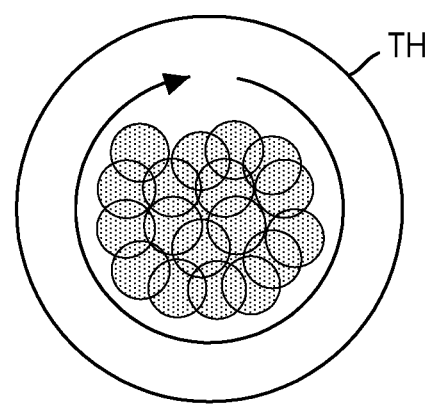
Figure 12:
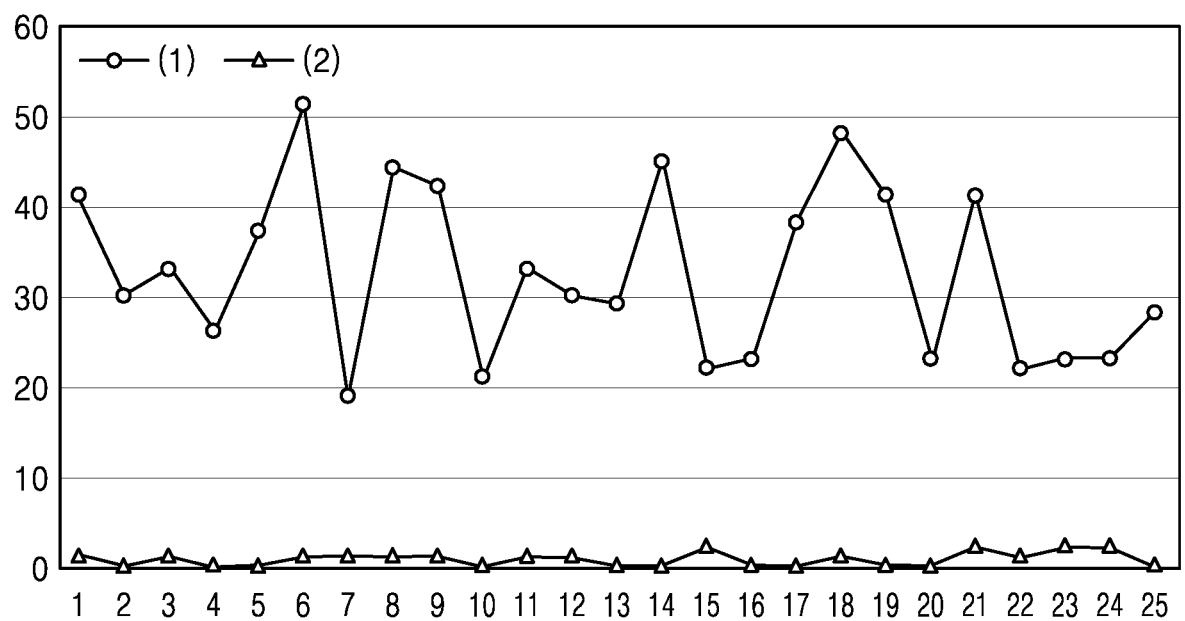
FIG. 12 is a graph showing the number of particles remaining in the opening when the opening of FIG. 7 is formed according to the method of FIGS. 10 and 11.

FIG. 7 is a schematic cross-sectional view of a part of first to fourth areas of FIG. 1, FIGS. 8 and 9 are schematic cross-sectional views of a manufacturing method of the display apparatus of FIG. 1, and FIGS. 10 and 11 are schematic plan views of a method of forming an opening of FIG. 7. FIG. 12 is a graph showing the number of particles remaining in the opening when the opening of FIG. 7 is formed according to the method of FIGS. 10 and 11.

Referring to FIG. 7, the display layer 200 is disposed on the substrate 100. The display layer 200 may have a structure in which multiple layers are stacked. For example, on the substrate 100, the buffer layer 101, the gate insulating layer 201, the first interlayer insulating layer 203, the second interlayer insulating layer 205, and the planarization layer 207 may be sequentially stacked. The pixel circuit PC may include the thin film transistor (TFT) and the storage capacitor (Cst), and the semiconductor layer and the electrodes of the thin film transistor (TFT) and the electrodes of the storage capacitor (Cst) may be disposed on the aforementioned insulating layers (e.g., 201, 203, 205), respectively.

On the planarization layer 207, the pixel electrode 221 may be disposed. For example, the pixel electrode 221 is disposed in the second area A2. The pixel electrode 221 may be connected to the thin film transistor of the pixel circuit PC through a contact hole of the planarization layer 207. For example, the pixel electrode 221 may be connected to the drain electrode DE of the thin film transistor TFT of the pixel circuit PC through a contact hole penetrating the planarization layer 207.

The pixel-defining layer 215 disposed on the pixel electrode 221 may include an opening overlapping the pixel electrode 221, and the opening of the pixel-defining layer 215 may define an emission area EA.

On the pixel-defining layer 215, the first functional layer 222a, the emission layer 222b, the second functional layer 222c, the opposite electrode 223, and the capping layer 230, which are sequentially stacked, may be disposed. Materials and characteristics of the display layer 200, which is disposed on the substrate 100, are the same as those described above with reference to FIG. 6.

The display layer 200 may include the opening TH at the location corresponding to the first area A1. The opening TH may be formed by removing the layers included in the display layer 200 described above. In one or more embodiments, when the display layer 200 is formed, the buffer layer 101, the gate insulating layer 201, the first interlayer insulating layer 203, the second interlayer insulating layer 205, the planarization layer 207, the first functional layer 222a, the second functional layer 222c, the opposite electrode 223, and the capping layer 230, which are formed over the first area A1, the second area A2, and the third area A3, may be removed from the opening TH. For example, in the opening TH, portions from the buffer layer 101 to the capping layer 230 are removed, and accordingly, no layers are stacked on the substrate 100, thereby exposing a surface of the substrate 100. In the first area A1, the substrate 100 may directly face the encapsulation substrate 300. As another example, the opening TH is filled with a transparent filler, and thus the structural stability of the display apparatus 10 (of FIG. 1) may be improved.

In one or more embodiments, a component 20 may overlap the first area A1. For example, the component 20 may be disposed under the substrate 100 (e.g., in the first area A1). The component 20 may be an electronic component configured to use light and/or sound. For example, the electronic component may include a sensor, for example, an infrared sensor, which receives and uses light, a camera that captures an image by receiving light, a sensor that measures a distance or recognizes fingerprints, etc. by outputting and detecting light or sound, a small lamp that emits light, a speaker that outputs sound, or the like. In the case of the component using light, light in various wavelength bands, such as, visible rays, infrared rays, or ultraviolet rays may be used.

Therefore, when the light transmittance of the first area A1 is low, the performance of the component 20 may degrade, and to prevent (or reduce) such degradation, the existence of foreign materials such as particles in the opening TH, during the formation of the opening TH, has to be prevented or reduced.

The encapsulation substrate 300 may face the substrate 100 and adhere thereto by the sealant ST in the fourth area A4. The encapsulation substrate 300 may include the same material and may have the same refractive index as the substrate 100. For example, the substrate 100 and the encapsulation substrate 300 may have refractive indices between about 1.3 and about 1.7, for example, about 1.5.

In the third area A3, the layers stacked on the substrate 100 are not removed (as in the second area A2), however, the pixel electrode 221 is not disposed. Thus, the third area A3 corresponds to the non-display area. As described above, the bypass wire DWL bypassing the first area A1 may be disposed in the third area A3.

Hereinafter, a manufacturing method of the display apparatus is described with reference to FIGS. 8-11. The manufacturing method of the display apparatus according to one or more embodiments may include forming the display layer 200 on the substrate 100, forming the opening TH (of FIG. 7) by irradiating laser onto the display layer 200, and attaching the substrate 100 and the encapsulation substrate 300 to each other (e.g., by the sealant ST).

The display layer 200 formed on the substrate 100 is the same as that described above, and a specific manufacturing method will not be described. When the display layer 200 is formed on the substrate 100 as shown in FIG. 8, the substrate 100 is located in a first chamber 1, and part of the display layer 200 is removed by irradiating laser L onto the display layer 200 as shown in FIG. 9, thereby forming the opening TH (of FIG. 7).

When the substrate 100 includes resin such as reinforced plastics, the substrate 100 may be disposed on a carrier substrate, and the opening TH (of FIG. 7) may be formed by irradiating the laser L onto the display layer 200 after the formation of the display layer 200 on the substrate 100. In such a case, the substrate 100 including the resin such as reinforced plastics is not removed by the irradiation of the laser. For example, only a part of the display layer 200 formed on the substrate 100 is removed by the irradiation of the laser to form the opening TH (of FIG. 7), and after the completion of the manufacturing process of the display apparatus 10 (of FIG. 1), the substrate 100 including the resin such as reinforced plastics may be separated from the carrier substrate.

The substrate 100 may be disposed on an electrostatic chuck 2 in the first chamber 1. For example, based on the drawing, the substrate 100 may be fixed to the electrostatic chuck 2 to make the display layer 200 face downwards.

For example, a laser irradiation unit 3 that irradiates the laser L may be disposed outside the substrate 100, and the laser L may be irradiated into the first chamber 1 through a transparent window W included in the first chamber 1. The irradiated laser L may be Green fs laser, but one or more embodiments are not limited thereto. In one or more embodiments, the laser irradiation unit 3 that irradiates the laser L may be located within the first chamber 1. Also, FIG. 9 illustrates that the laser L is directly irradiated onto the display layer 200, but as another example, the laser L may be irradiated toward the substrate 100, and only a part of the display layer 200 may be removed without damaging the substrate 100 by irradiation of the laser L.

The first chamber 1 may maintain the vacuum atmosphere when the laser L is irradiated such that particles generated when a portion of the display layer 200 is removed by the irradiation of laser L may drop (or fall down). Also, the first chamber 1 includes a baffle 4 for collecting the falling particles to prevent (or reduce) contamination of the first chamber 1 by particle scattering or adhesion of the particles to the display layer 200.

The laser L may be spirally moved, and the opening TH (of FIG. 7) may be formed. Also, the laser L may be irradiated at least twice. For example, the laser L may be irradiated twice. Also, an overlap ratio of spots of the irradiated laser L may differ according to the number of irradiations of the laser L. For example, when the opening TH (of FIG. 7) is formed by irradiating the laser L twice, an overlap ratio of spots of the laser L irradiated first may be greater than an overlap ratio of spots of the laser L secondly irradiated. In other words, an irradiation time of the laser L irradiated first may be greater than that of the laser L secondly irradiated.

When the opening TH (of FIG. 7) is formed by irradiating the laser L twice, the laser L irradiated first may be used to form the opening TH by removing the display layer 200, and the laser L secondly irradiated may be used to complete the opening TH (of FIG. 7) and remove particles remaining therein. Therefore, by irradiating the laser L two or more times at the same location when the opening TH (of FIG. 7) is formed, the existence of the particles in the opening TH (of FIG. 7) may be prevented or reduced.

In one or more embodiments, the spiral irradiation of the laser may effectively prevent the particles from scattering in a laser irradiation direction. Therefore, by preventing (or reducing) the attachment of the particles to other portions of the display layer 200, the degradation in the display quality of the display apparatus 10 (of FIG. 1) may be prevented or reduced.

When the laser L is irradiated, an intensity of the laser L irradiated once may differ according to locations of spots of the laser L. In one or more embodiments, during the spiral irradiation of the laser L, the intensity of the laser L at the center of a spiral may be less than that of the laser L on an outer portion of the spiral. Thus, the opening TF (of FIG. 7) having an accurate shape may be formed.

FIGS. 10 and 11 schematically illustrate a laser irradiation method to form the opening TH. First of all, FIG. 10 illustrates an conventional laser irradiation method, and the laser is irradiated rectilinearly in one direction. In one or more embodiments, the laser L is irradiated rectilinearly in one direction in a region where the opening TH is formed and then irradiated rectilinearly in the direction again in a next row. FIG. 11 illustrates a method whereby the laser is irradiated by forming a spiral movement path.

When the opening TH is formed according to the method of FIG. 10, because the laser is discontinuously irradiated by changing rows, a discontinuous pattern is inevitably formed at the edge of the opening TH. However, when the opening TH is formed according to the method of FIG. 11, the boundary of the opening TH is smoothly formed.

Also, FIG. 12 illustrates the number of particles remaining in the opening TH when the opening TH is formed according to the method of each of FIGS. 10 and 11. The number of particles may be obtained by counting the particles having sizes of at least 20 µm.

For example, FIG. 12(1) indicates the number of particles remaining in each opening TH after 25 openings TH are formed according to the method of FIG. 10. FIG. 12(2) indicates the number of particles remaining in each openings TH when each of 25 openings TH was formed by spirally irradiating the laser twice according to the method of FIG. 11.

As shown in FIG. 12, when the opening TH is formed according to the method illustrated by FIG. 10, the number of particles in the opening TH may be substantially equal to at least 20 or 50 at most. On the contrary, when the opening TH is formed by spirally irradiating the laser twice according to the method illustrated by FIG. 11 of the present disclosure, the particles remaining in the opening TH may be reduced to at least 2, which is reduced by 95% or more compared to FIG. 12(1). As a result, the transmittance of the first area A1 (of FIG. 7) may be maintained to 90% or more.

When there are five particles having a size of about 20 µm in the opening TH, the transmittance of the first area A1 (of FIG. 7) may be decreased by about 0.26% to about 0.57%. When there are ten particles, the transmittance of the first area A1 (of FIG. 7) may be decreased by about 0.51% to about 1.15%. For example, according to the present disclosure, when the opening TH is formed, the existence of the particles may be prevented or reduced, and thus, the first area A1 (of FIG. 7) may have great transmittance. Also, the degradation in the performance of the component 20 (of FIG. 7) overlapping the first area A1 may be prevented or reduced.

After the opening TH is formed, the substrate 100 is taken out of the first chamber 1, and the substrate 100 and the encapsulation substrate 300 are transferred to a second chamber different from the first chamber 1. Then, the substrate 100 and the encapsulation substrate 300 may be attached to each other by the sealant ST. For example, the sealant ST is spread on the substrate 100 to surround the display layer 200, and while the substrate 100 and the encapsulation substrate 300 adhere to each other, the sealant ST, on which the laser is irradiated, is hardened, thus attaching the substrate 100 and the encapsulation substrate 300 to each other.

As another example, when the substrate 100 includes resin such as reinforced plastics, the display layer 200 on the substrate 100 may be sealed by an encapsulation layer including an inorganic encapsulation layer and an organic encapsulation layer alternately stacked. For example, the encapsulation layer may include a first inorganic encapsulation layer, an organic encapsulation layer, and a second inorganic encapsulation layer that are sequentially stacked.

According to one or more embodiments, as a transmission area has great transmittance, the degradation in the performance of a component, for example, a camera, which is disposed in the transmission area, may be minimized or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims.

What is claimed is:

1. A manufacturing method of a display apparatus comprising:
    forming a display layer on a substrate;
    forming an opening by irradiating laser onto the display layer; and
    sealing the display layer formed on the substrate,
    wherein the laser is irradiated according to a spiral movement path,
    wherein the opening is formed by irradiating the laser at least twice at the same location to remove the display layer on the substrate,
    wherein the substrate is not removed by the irradiation of the laser, and
    wherein the sealing comprises attaching an encapsulation substrate to the substrate using a sealant, such that the encapsulation substrate covers the opening and the substrate.

2. The manufacturing method of claim 1, wherein the laser is irradiated twice to form the opening.

3. The manufacturing method of claim 2, wherein an overlap ratio of spots of the laser first irradiated is greater than an overlap ratio of spots of the laser secondly irradiated.

4. The manufacturing method of claim 1, wherein the substrate formed on the display layer is located within a first chamber before the irradiation of the laser, and wherein the first chamber is configured to maintain a vacuum atmosphere when the laser is irradiated.

5. The manufacturing method of claim 4, wherein, in the first chamber, the substrate is fixed to make the display layer face downwards.

6. The manufacturing method of claim 4, wherein the substrate is attached to the encapsulation substrate in a second chamber different from the first chamber, and wherein the substrate and the encapsulation substrate are attached to each other and directly face each other in the opening.

7. The manufacturing method of claim 1, wherein an intensity of the laser differs according to a location of a spiral.

8. The manufacturing method of claim 1, wherein the display apparatus comprises a first area that is a transmission area, a second area that surrounds the first area and configured to display an image, and a third area located between the first area and the second area, the third area being a non-display area, and wherein the opening is formed corresponding to the first area.

9. The manufacturing method of claim 1, wherein an electronic component is located at a location overlapping the opening.

10. A manufacturing method of a display apparatus comprising a first area that is a transmission area, a second area that surrounds the first area and configured to display an image, and a third area located between the first area and the second area, the third area being a non-display area, the manufacturing method comprising:

forming, on a substrate, a display layer comprising a thin film transistor, an organic light-emitting diode electrically connected to the thin film transistor, and a capping layer on an opposite electrode of the organic light-emitting diode; and forming an opening at a location corresponding to the first area by irradiating laser onto the display layer in a vacuum atmosphere, wherein the thin film transistor and the organic light-emitting diode are located in the second area, and wherein when the display layer is formed, a gate insulating layer between a semiconductor layer and a gate electrode of the thin film transistor, an interlayer insulating layer on the gate electrode, a planarization layer covering the thin film transistor, the opposite electrode, and the capping layer, which are formed in the first, second, and third areas, are removed from the first area due to irradiation of the laser.

11. The manufacturing method of claim 10, further comprising:

forming a buffer layer on the substrate before the display layer is formed, wherein the buffer layer is removed from the first area due to the irradiation of the laser.

12. The manufacturing method of claim 11, further comprising sealing the display layer on the substrate.

13. The manufacturing method of claim 12, wherein the substrate is attached to an encapsulation substrate, and the substrate and the encapsulation substrate directly face each other in the opening.

14. The manufacturing method of claim 11, wherein an electronic component is located at a location overlapping the opening.

15. The manufacturing method of claim 10, wherein the laser is spirally irradiated.

16. The manufacturing method of claim 15, wherein the laser is irradiated at least twice at the same location.

17. The manufacturing method of claim 16, wherein an intensity of the laser at a center of a spiral is less than an intensity of the laser at an outer portion of the spiral.

18. The manufacturing method of claim 16, wherein the laser is irradiated twice.

19. The manufacturing method of claim 18, wherein an irradiation time of the laser first irradiated is greater than an irradiation time of the laser secondly irradiated.

20. The manufacturing method of claim 18, wherein an overlap ratio of spots of the laser first irradiated is greater than an overlap ratio of spots of the laser secondly irradiated.

* * * * *